(12) United States Patent
Joye

(10) Patent No.: US 7,433,905 B2
(45) Date of Patent: Oct. 7, 2008

(54) DEVICE AND METHOD FOR PROCESSING DIGITAL VALUES IN PARTICULAR IN NON-ADJACENT FORM

(75) Inventor: Marc Joye, Saint Zacharie (FR)

(73) Assignee: Gemplus, Gemenos (FR)

( * ) Notice: Subject to any disclaimer, the term of this patent is extended or adjusted under 35 U.S.C. 154(b) by 942 days.

(21) Appl. No.: 10/467,514

(22) PCT Filed: Feb. 5, 2002

(86) PCT No.: PCT/FR02/00426

§ 371 (c)(1),
(2), (4) Date: Feb. 6, 2004

(87) PCT Pub. No.: WO02/065645

PCT Pub. Date: Aug. 22, 2002

(65) Prior Publication Data

US 2004/0119614 A1    Jun. 24, 2004

(30) Foreign Application Priority Data

Feb. 9, 2001    (FR)    ................................. 01 01789

(51) Int. Cl.
   *G06F 15/00* (2006.01)
(52) U.S. Cl. ........................ 708/204; 708/493
(58) Field of Classification Search ................ 708/204, 708/493
See application file for complete search history.

(56) References Cited

U.S. PATENT DOCUMENTS 5,170,371 A * 12/1992 Darley ........................ 708/551

5,570,309 A * 10/1996 Miyoshi et al. ............ 708/493

(Continued)

FOREIGN PATENT DOCUMENTS

EP    0933695 A    8/1999

(Continued)

OTHER PUBLICATIONS

Srinivas et al., "High-Speed VLSI Arithmetic Processor Architectures using Hybrid Number Representation", Proceedings of the International Conference on Computer Design-VLSI in Computers and Processors, Cambridge, MA, Oct. 14-16, 1991 Los Alamitos, IEEE Comp. Soc. Press, US, p. 564-571.

(Continued)

*Primary Examiner*—Tan V. Mai
(74) *Attorney, Agent, or Firm*—Buchanan Ingersoll & Rooney PC

(57) ABSTRACT

A table establishes correspondence between first sets of at least one number, expressed in accordance with a signed code where each number may have the value of 0, 1 or −1, and second sets of at least one number, expressed according to a simple form where each number may have the value 0 or 1. An input sequence of numbers is decomposed into sets of numbers present in the correspondence table. For each set of numbers derived from the decomposition, a corresponding set of numbers is given by the correspondence table. A sequence of numbers is compiled from the sets retrieved from the table. The invention is in particular useful in various algorithms, such as in cryptography, for example to store values in signed binary mode, in compact non-adjacent form with only the numbers 0, 1 and/or for rapidly producing random numbers in the non-adjacent form.

58 Claims, 4 Drawing Sheets

U.S. PATENT DOCUMENTS 5,815,420 A * 9/1998 Steiss .................. 708/524
5,907,499 A    5/1999 Suzuki

OTHER PUBLICATIONS

Chin-Long Wey et al., "A Self-Timed Redundant-Binary Number to Binary Number Converter for digital Arithmetic Processors", Computer Design: VLSI in Computers and Processors, 1995 ICCD 1995, Proceedings, 1995 IEEE International Conference, p. 386-391, Austin, Texas, US.

Herrfeld A. et al., "Conversion of Redundant Binary into Two's Complement Representations", Electronic Letters, IEE Stevenage, GB, 1995, vol. 13, No. 14.

Joye, J. et al., "Optimal left-to-Right Binary Signed-Digit Recording" IEEE Transactions on Electronic Computers, IEE Inc., New York, US, 2000, vol. 49, No. 7.

Koyama, K. et al., Speeding Up Elliptic Cryptosystems By Using A Signed Binary Window Method:, Advances in Cryptology—Annual International Cryptology Conference, , Proceedings, Springer-Verlag, XX, vol. 40, 1993, p. 345-357.

* cited by examiner

Compact coding from right to left

I. "Right-left" correspondence table

Digits in NAF ⟷ "Right-left" compact coding form
01 ⟷ 01
0$\bar{1}$ ⟷ 11
0 ⟷ 0

II. : e.g. N=29: 1 1 1 0 1 (simple binary)

NAF (29): <1 0 0 $\bar{1}$ 0 1> (Reitwiesner)

NAF decomposition (29):

1 0 11 01 = "right-left" compact coding of NAF (29)

Compact coding from left to right

I. "Left-right" correspondence table

Digits in NAF ⟷ "Left-right" compact coding form
10 ⟷ 10
$\overline{1}$0 ⟷ 11
0 ⟷ 0

II. : e.g. N=29: 1 1 1 0 1 (simple binary)

NAF (29): <1 0 0 $\overline{1}$ 0 1> (Reitwiesner)

NAF decomposition (29):

this "0" is added artificially to complete the sequence this "0" is truncated at the end of coding 10 0 11 1 = "left-right" compact coding of NAF (29)

Exchange of keys (Diffie-Hellman method)

Enciphering (El Gamal method)

DEVICE AND METHOD FOR PROCESSING DIGITAL VALUES IN PARTICULAR IN NON-ADJACENT FORM

The invention relates to a device and method for representing and using numbers, allowing optimisation of their storage and algorithmic processing possibilities.

In conventional digital electronics, simple binary coding is used to express numbers, the latter being able to correspond to arithmetic numerical values or to commands etc. Simple binary coding uses two possible digits, 0 and 1, referred to as bits, in order to express numbers to the base 2. An n-bit binary word therefore makes it possible to express $2^n$ different values (from 0 to $2^n-1$ inclusive) by as many possible combinations of values of bits according to known rules. This binary coding has the advantage of making it possible to establish a direct correspondence between each bit and a two-state electrical signal element, in accordance with digital technology (non-linear electronics). For example, the digits 0 or 1 can be represented respectively by a high voltage level and a low voltage level of the signal element.

For storing numbers, use is made of memories comprising elementary cells, each being able to be positioned selectively at one from amongst these two states 0 or 1. In this way, one memory cell suffices to store one bit of a binary number.

There also exists a way of writing numbers which uses the digits 0, 1 and −1, according to the so-called "signed binary digit representation". In this representation, an integer number k is a sequence of digits $<\ldots, k_2, k_1, k_0>$ with $k_i \in \{0,1,-1\}$. It is therefore possible to write $k = \Sigma k_i 2^i$ for i=0 to ∞.

In this case, the writing of a number is not necessarily unique. For example, the set $\{0,1,-1\}$ can serve to express the number 3 by $<1,1>$ (that is to say $2^1+2^0$) or by $<1,0,-1>$ (that is to say $2^2-2^0$).

A particular form of signed binary digit is known by the term "non-adjacent form", which will be referred hereinafter as NAF. An NAF representation has the following property: the product of two consecutive digits $k_i$ and $k_{i+1}$ is always zero. This therefore gives the condition:

$$k_i.k_{i+1}=0, \text{ for any } i \quad (1)$$

It has been demonstrated by Reitwiesner ("Binary Arithmetic", Advances in Computers, Vol. 1, pp. 231-308, 1960) firstly that any integer has exactly only one NAF representation, and secondly that the NAF representation has the minimum Hamming weight. In other words, in order to express a numerical value, the non-adjacent form uses the smallest possible number of non-zero digits (that is to say 1 and −1).

This property is of interest when the values are used in algorithms which make a great deal of use of multiplications or additions on sets denoted additively, such as fast exponentiation algorithms, including on elliptic curves. This is because, the more digits 1 and −1 there are in the representation of the number to be processed, the more expensive the algorithm is in terms of hardware resources and execution time. The representations which contain a high proportion of zeros are then sought.

However, the representation of the numbers in NAF form has the drawback of requiring twice as many bits because, for each digit 0, 1, −1, an additional bit must be associated in order to indicate the sign. Thus, for each digit, a first bit is used to indicate the sign and a second bit to express the quantity associated with this sign.

In a normal protocol, the coding of the digits in NAF form is as follows: 0≡00; 1≡01; −1≡11.

Compared with conventional binary coding (0 and 1 only), the NAF form therefore requires twice as much memory in order to store the same number.

There are therefore two possibilities when a number is considered for processing in NAF form:

either the numbers are stored in memory in simple binary form and subsequently only coding to its non-adjacent form is performed, in order to benefit from the most compact form for storage. In this case, it is necessary to have available adequate memory space (for example in fixed memory of the ROM type) in order to contain the algorithm necessary for the real-time coding of the non-adjacent form. Moreover, execution of the coding algorithm to the NAF form gives rise to undesirable delays;

or the numbers are stored directly in their NAF form, the latter being previously coded. In this case, twice as much memory is used for storing each number.

In the light of the above, the invention proposes a novel coding of numbers making it possible to keep the algorithmic advantages of the representation of the numbers in NAF form, whilst using substantially the same memory space for the storage of the numbers compared with a simple binary representation.

According to a first aspect, the invention proposes a device for processing numerical values, comprising first storage means and first conversion means, characterised in that the first storage means comprise at least one correspondence table or equivalent between on the one hand first sets of at least one digit, expressed according to a signed code where each digit can have the value 0, 1 or −1, and on the other hand second sets of at least one digit, expressed according to a simple form where each digit can have the value 0 or 1, and in that the conversion means comprise:

means of inputting values to be processed in the form of a sequence of digits;

decomposition means in order to decompose the sequence of digits into sets of digits appearing in the correspondence table;

extraction means for extracting from the correspondence table, for each set of digits issuing from the decomposition, the corresponding set of digits given by the correspondence table, compilation means for compiling a sequence of digits from the sets thus extracted by the extraction means, and means of outputting the sequence compiled by the compilation means.

In a preferred embodiment, each of the sets thus matched by the said correspondence table has the same number of digits.

The conversion means preferably process k values expressed in signed binary mode in non-adjacent form, formed by a sequence of digits $<\ldots, k_2, k_1, k_0>$ with $k=\Sigma k_i b^i$, where b is any symbol, the $k_i$ values are in the set $\{0,1,-1\}$ and satisfy the condition $k_i.k_{i+1}=0$ for any i in the sequence.

For example, it is possible to have b=2, giving $k=\Sigma k_i 2^i$.

The first sets in the correspondence table advantageously comprise one or two digits where one of them, for example the first digit, is 0.

The correspondence table can establish the following correspondences between the first and second sets of digits:

| first set of digits | | second set of digits |
|---|---|---|
| (0, 1) | ↔ | (0, 1) |
| (0, −1) | ↔ | (1, 1) |
| (0) | ↔ | (0) |

The correspondence table can also establish the following correspondences between the first and second sets of digits:

| first set of digits | | second set of digits |
|---|---|---|
| (1, 0) | ↔ | (1, 0) |
| (−1, 0) | ↔ | (1, 1) |
| (0) | ↔ | (0) |

The device can be designed to accept as an input and process a value k expressed in a signed binary form, formed by a sequence of digits $<\ldots, k_2, k_1, k_0>$ with $k_i$ in the set $\{0, 1, -1\}$ and satisfying the condition $k_i \cdot k_{i+1} = 0$, for any i in the sequence, the decomposition means producing from this value at least a first set of digits in the correspondence table, the extraction means obtaining therefrom at least one second corresponding set of digits, and the compilation means forming a sequence from the second set or sets thus extracted.

In this case, using the first correspondence table mentioned above, the conversion means can possibly add a digit 0 to the left of the sequence of digits input $<k_n, \ldots, k_2, k_1, k_0>$ (i.e. in front of the digit $k_n$) in order to form a sequence to be decomposed, the decomposition means identifying in this the sets of digits appearing in the first sets in the table, commencing from the set situated furthest to the right (i.e. containing the digit $k_0$) and finishing with the set furthest to the left (i.e. containing $k_n$ or the added digit 0), the compilation means forming a compiled sequence, formed from simple binary digits, collecting together the second sets corresponding to these first sets, obtained by the extraction means, these second sets being placed according to the same topology as the first corresponding sets in the decomposed sequence.

The compilation means can then truncate any digit 0 at the head (i.e. to the left) of the compiled sequence before delivering the latter to the output means.

When the above second correspondence table is used, the conversion means can possibly add a digit 0 to the right of the sequence of digits $<k_n, \ldots, k_2, k_1, k_0>$ (i.e. after the digit $k_0$) in order to form a sequence to be decomposed, the decomposition means identifying in the latter the sets of digits appearing in the first sets in the table, commencing from the set situated furthest to the left (i.e. containing the digit $k_n$) and finishing with the set furthest to the right (i.e. containing $k_0$ or the added digit 0), the compilation means forming a compiled sequence, formed from simple binary digits, collecting together the second sets corresponding to these first sets, obtained by the extraction means, these second sets being placed according to the same topology as the corresponding sets in the decomposed sequence.

The compilation means can then truncate any digit 0 at the end (i.e. to the right) of the compiled sequence before delivering the latter to the output means.

The output means can be connected to second storage means intended to store at least one compiled sequence as a compact coding sequence for a corresponding value expressed in signed binary form.

The conversion means are configured to effect an inverse transformation in order to reproduce a value expressed in non-adjacent form from a compiled sequence.

In one embodiment, the device also has processing means comprising:
  means of access to the second storage means in order to supply a compiled sequence to the input means,
  the conversion means configured to effect a conversion of this sequence into a signed binary representation in non-adjacent form of the value k associated with this compiled sequence, and
  algorithmic calculation means functioning with at least one variable expressed by a signed binary representation in non-adjacent form, supplied by the conversion means.

In this case, the calculation means can be designed so as, for example, to carry out a scalar multiplication on an elliptic curve.

The conversion means can establish a conversion (R) of a value k expressed in simple binary mode to a representation in signed binary mode in non-adjacent form (R(k)).

Advantageously, the conversion (R) permutes with the set $\{NAF(k)|k \in \{0,1\}^r\}$, where r is the maximum number of simple binary digits able to express the value k to the base 2, and NAF(k) corresponds to the expression of the value k in signed binary mode in non-adjacent form.

The device can also comprise means of creating random numbers expressed in signed binary mode in non-adjacent form, the device having a generator of random numbers of r bits which renders random numbers in simple binary form, these numbers being supplied to the means of inputting values to be processed, the conversion means establishing a conversion (R) of this number to a representation in signed binary mode in non-adjacent form (R(k)) and transmitted to the output means of the compiled sequence as a random number in signed binary mode in non-adjacent form.

In this case, the device can also comprise algorithm calculation means functioning with at least one random number expressed by a signed binary representation in non-adjacent form, supplied by the conversion means.

By way of example, the algorithmic calculation means can be designed to produce cryptographic algorithms.

The cryptographic algorithm can be a key exchange algorithm, for example according to the Diffie-Hellman method on elliptic curves, or a data enciphering algorithm, for example according to the El Gamal method on elliptic curves, or a digital signature algorithm, for example according to the ECDSA (Elliptic Curve Digital Signature Algorithm) method on elliptic curves.

According to a second aspect, the invention relates to a smart card integrating the aforementioned device.

According to a third aspect, the invention relates to the use of the aforementioned device for the processing of digital values in signed binary mode expressed in non-adjacent form and the storage of these values in the form of a compiled sequence obtained by the compilation means.

According to a fourth aspect, the invention relates to a method for processing numerical values, characterised in that it comprises the steps of:
  establishing at least one correspondence table between on the one hand first sets of at least one digit, expressed according to a signed binary code where each digit can have the value 0, 1 or −1, and on the other hand second sets of at least one digit, expressed according to a simple binary form where each digit can have the value 0 or 1, and carrying out a conversion by the steps of:
taking as an input values to be processed in the form of a sequence of digits,
decomposing the sequence of digits into sets of digits appearing in the correspondence table;
extracting from the correspondence table, for each set of digits issuing from the decomposition, the set of corresponding digits given by the correspondence table,
compiling a sequence of digits from the sets thus extracted, and
outputting the sequence compiled by the compilation means.

The optional characteristics mentioned above in the context of the device apply mutatis mutandis to this method.

According to a fifth aspect, the invention relates to the use of the method in a chip card.

According to a sixth aspect, the invention relates to the processing of numerical values in signed binary mode expressed in non-adjacent form and the storage of these values in the form of a compiled sequence obtained by the compilation step.

The invention and the advantages which stem therefrom will be better understood from a reading of the preferred embodiments, given purely by way of non-limiting examples, with reference to the accompanying drawings, in which.

Figure 1:
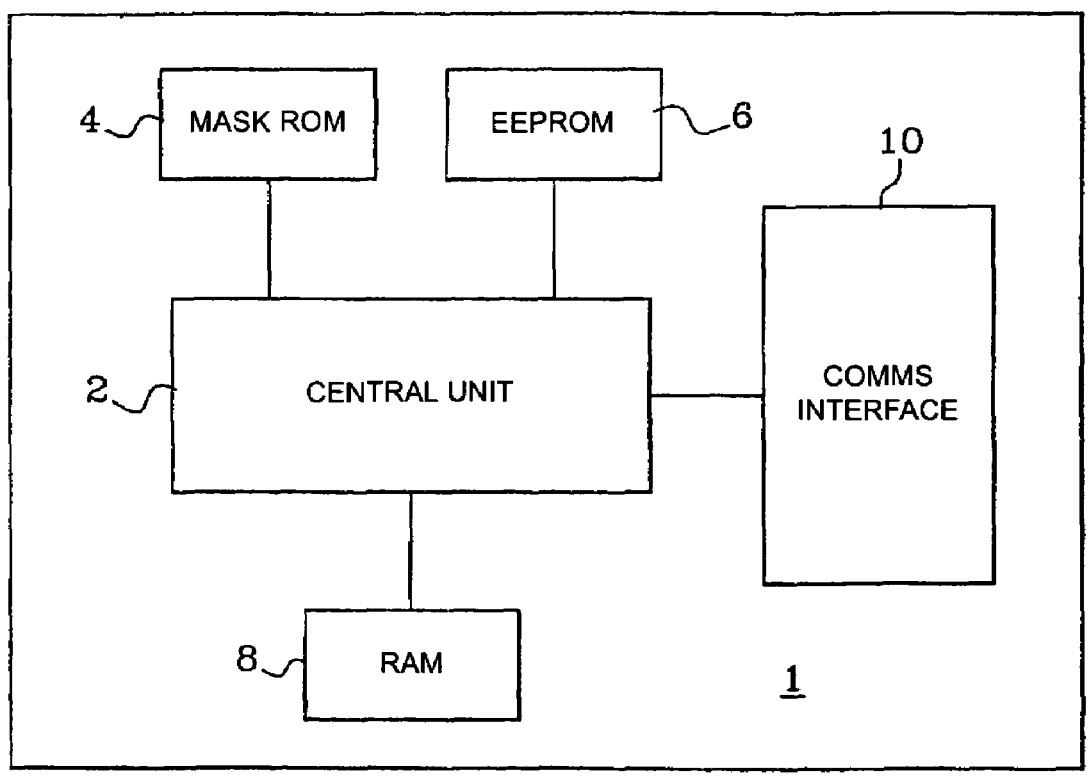
FIG. 1 is a simplified block diagram of algorithmic calculation means, integrated in a chip card, for implementing the invention.

FIG. 1 depicts in block diagram form a device 1 programmed in accordance with the invention, in this case a chip card intended to execute a cryptographic program. The device comprises data elements which are fixed, but able to vary from one destination to another, and which are therefore stored in a rewritable memory portion, and a cryptographic algorithm which is stored in a mask ROM memory. This type of memory is pre-programmed at the time of design, at the level of the lithographic masks.

In the example, the device 1 combines in a chip means programmed for the execution of calculations (calculation means), composed of a central unit (CU) 2 functionally connected to a set of memories including:
a memory accessible in read mode only, of the mask ROM type 4, also known by the term "mask read only memory (mask ROM)",
an electrically reprogrammable memory, of the EEPROM type 6 ("electrically erasable programmable ROM"), and
a memory accessible in read mode and write mode of the RAM type 8 ("random access memory"), or a EEPROM memory.

All these memories 4, 6 and 8, as well as the central unit 10, can be produced on a single chip.

The central unit 2 is also connected to a communication interface 10 which provides the exchange of signals vis-a-vis the outside and the power supply to the chip.

One of the functions of the calculation means 1 is to encipher and decipher confidential data respectively transmitted to and received from the outside.

For this purpose, the central unit 2 executes the cryptographic algorithm using programming data stored in the mask ROM 4 and EEPROM 6 parts.

According to the invention, the central unit is designed to execute cryptographic algorithms with values expressed in the non-adjacent form (NAF) described in the introduction, but after a compacting conversion those principles will now be described.

The compacting of the non-adjacent forms in accordance with the present invention makes it possible to express them in a form which will be designated "compact coding". One of the characteristics of this compact coding is the absence of a routine sign bit in the bits of the numbers thus represented. The result is a saving in storage of these numbers without for all that impairing the efficacy of their algorithmic processing relative to a representation in conventional non-adjacent form (NAF).

The process of representing numbers in compact coding form is implemented using a number N previously expressed in non-adjacent form, which will be designated NAF(N).

The NAF(N) representation of the number N therefore has the general form $k=\Sigma k_i 2^i$, with $k_i \in \{0,1,-1\}$, and the condition $k_i . k_{i+1} = 0$, for any i (cf. expression (1) above).

The method for converting a number expressed in simple binary to its non-adjacent form is known, in particular from the article by Reitwiesner cited in the introduction.

It should be noted that, in the NAF(N) form, because the product of two adjacent digits is always zero, the digit 1 is always followed (and preceded) by a 0, and likewise the digit −1 is always followed (and preceded) by a 0.

The compact coding according to the invention takes account of this specificity by carrying out a processing according to a coding table.

This processing will be described in the context of a concrete case, in this case the case of N=29, with reference to FIG. 2. This example uses a compact coding form according to the invention referred to as "from right to left" (or more simply "right-left") for reasons which will be apparent.

At the basis of compact coding is a correspondence table which makes it possible to obtain, from one or two digits of the non-adjacent form, corresponding digits of the compact coding. This correspondence table can for example be stored in the mask ROM part 4 of the device 1.

In the case of the embodiment envisaged for "right-left" compact coding, the correspondence table is as follows (cf. FIG. 2, Section I).

TABLE I

| correspondence table for "right-left" compact coding | | |
|---|---|---|
| Sequence in the NAF sequence | | "Right-left" compact coding form |
| (0, 1) | ↔ | (0, 1) |
| (0, −1) | ↔ | (1, 1) |
| (0) | ↔ | (0) |

In order to carry out the right-left compact coding of a number in NAF(N) representation, the conversion rules of this table are applied, commencing the operations with the digits situated on the right and going towards the left of the NAF expression.

Figure 2:
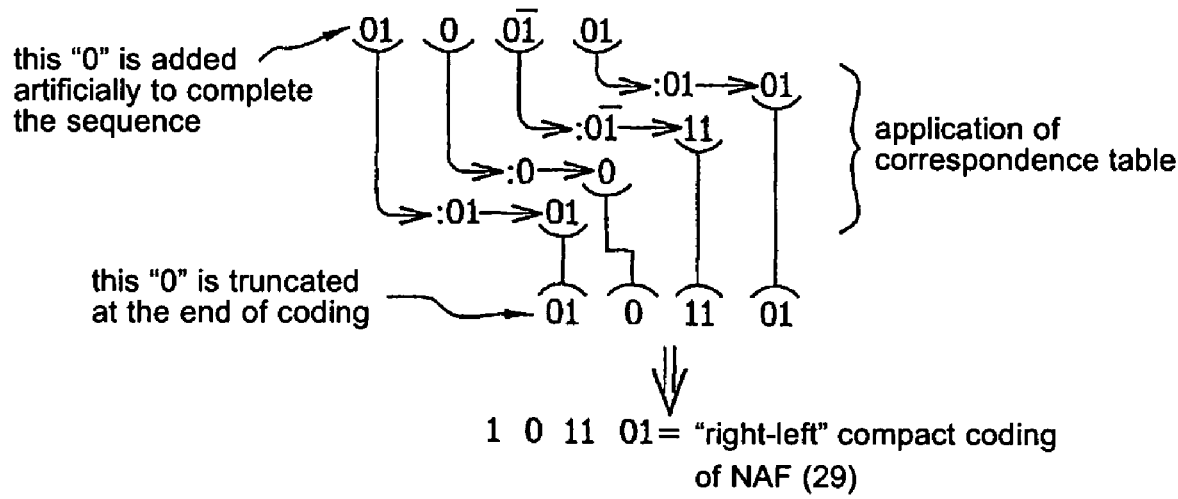
FIG. 2 is a block diagram explaining the conversion of numbers from a non-adjacent form into compact coding of the "right-left" type in accordance with the invention.

Thus, for the example of the number 29 (whose simple binary representation is 11101), first of all its NAF form is obtained for example according to the Reitwiesner method, which gives <1 0 0 −1 0 1> (FIG. 2, Section II).

In the NAF sequence, by scanning all the digits of the right to left representation, the occurrences (0,1), (0,−1) and (0) are identified and are replaced by what corresponds to them in compact coding (0,1), (1,1) and (0), respectively. It should be noted that, at each step, one or two digits of the NAF representation are processed. There is only one digit processed when it is a 0 and two digits when the first digit is non-zero. In the latter case, through the property of non-adjacency, the second digit in the pair of digits processed is necessarily 0. The following digit of the NAF representation is then passed to and finally the entire representation in compact coding is obtained throughout. It is possible that the last digit of the NAF representation to be scanned is 1 or −1; in this case an artificial 0 is added in front of this digit in order, in accordance with the table, to replace the pair (0,1) with (0,1) or the pair (0,−1) with (1,1). The final compact representation is obtained by concatenating the various compact codings thus obtained, respecting the order. In the case where the last digit (i.e. the digit furthest to the left) of the final compact representation is 0, it can be ignored.

Applied to the example NAF(29)=<1,0,0,−1,0,1>, the first digit to the right (i.e. 1) is first of all scanned. As this is non-zero, the following digit is scanned (i.e. the second digit commencing with the right, 0) and in accordance with the table the pair (0,1) is replaced with (0,1). The following digit in the NAF representation is −1; this being non-zero, the following digit (i.e. 0) is considered and the pair (0,−1) is replaced with (1,1) in accordance with the rules of the table. The following digit of the NAF representation is 0 (i.e. the fifth 0 commencing with the right); it is replaced in accordance with the table with 0. Finally, the following digit of the NAF representation is 1 (i.e. the sixth digit commencing with the right). As explained above, an artificial 0 is added in front of it and, in accordance with the table, the pair obtained (0,1) is converted by (0,1). In summary, NAF(29)=<1,0,0,−1,0,1> is divided from right to left into the series of blocks (0,1), (0), (0,−1), (0,1), which are converted by the correspondence table into (0,1), (0), (1,1), (0,1). The final compact coding is then obtained by concatenating these various blocks obtained from right to left, respecting their order. Thus the compact representation of NAF(29) is 0101101. At the end of coding, the 0 situated at the left-hand end can possibly be truncated in order to obtain the representation 101101.

By virtue of the compact coding of the invention, the storage efficiency of the coding which there was with a simple binary representation is found once again. This is because the storage of a number in its recoded non-adjacent (i.e. compact) form requires at most one bit more than the storage of the same number in its conventional binary form.

In practice, what is stored for a number is a binary series of its compact coding. For example, for the number 29, the binary series 101101 (read from right to left) is stored. What is needed for the calculations is the non-adjacent form of the digit. To do this, one proceeds in the opposite direction.

The decoding is also carried out from the same conversion table as for coding, but where the inputs and outputs have been permuted, cf. Table I.b below.

TABLE Ib correspondence table for "right-left" compact decoding

| Digits in the "right-left" compact coding sequence | | NAF form |
|---|---|---|
| (0, 1) | ↔ | (0, 1) |
| (1, 1) | ↔ | (0, −1) |
| (0) | ↔ | (0) |

Just as with coding, the digits of the representation in "right-left" compact coding form are scanned from right to left.

In this sequence of digits, the occurrences (0,1), (1,1) and (0) are identified, and they are replaced respectively, in accordance with the table, with (0,1), (0,−1) and (0). By concatenating the blocks thus obtained, the corresponding representation in NAF form is found. As before, if the last digit scanned of the compact form is non-zero, it is possible to add a 0 in front of it in order to be able to apply the rules of the correspondence table. Finally, if the last digit (i.e. the digit furthest to the left) of the resulting NAF form is zero, it can be ignored.

Thus the compact coding of NAF(29) is <1,0,1,1,0,1>. Starting from the right, the first digit is scanned (i.e. the 1 furthest to the right). As it is non-zero, the following digit (i.e. the second digit 0 commencing with the right) is scanned. The correspondence table associates the pair of digits (0,1) with the pair of digits (0,1). The following digit of the compact form (i.e. the third digit 1 commencing with the right) is next scanned. This being non-zero, the following digit (i.e. the fourth 1 commencing with the right) is scanned. The correspondence table associates the pair (1,1) with the pair (0,−1). The following digit which is scanned in the compact representation is 0 (i.e. the fifth digit 0 commencing with the right). This being zero, (0) is associated with it by means of the correspondence table. The following digit of the compact representation is 1 (i.e. the sixth 1 commencing with the right). A 0 is artificially added in front of it and, by means of the correspondence table, the pair (0,1) is associated with the pair (0,1). Finally, the NAF representation is obtained by concatenating, respecting the order, from right to left, the blocks obtained by the correspondence table: (0,1), (0), (0,−1), (0,1) concatenated, giving <0,1,0,0,−1,0,1>. The figure furthest to the left being zero, it can be truncated and finally NAF(29)=<1,0,0,−1,0,1> is found.

Figure 3:
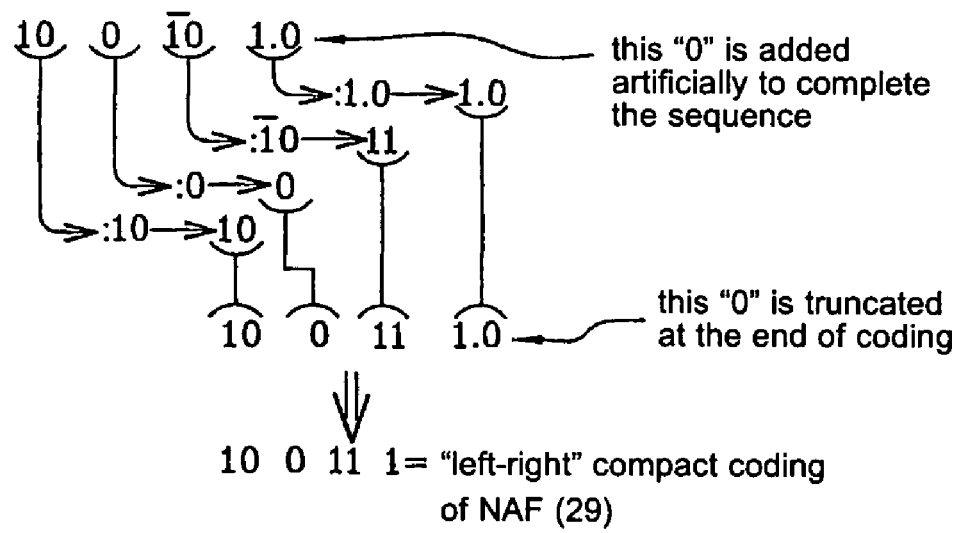
FIG. 3 is a block diagram explaining the conversion of numbers from a non-adjacent form into compact coding of the "left-right" type in accordance with the invention.

In the case of the embodiment envisaged for the "left-right" compact coding, the correspondence table is as follows (cf. FIG. 3, Section I).

TABLE II correspondence table for the "left-right" compact coding

| Digit in the NAF sequence | | "left-right" compact coding form |
|---|---|---|
| (1, 0) | ↔ | (1, 0) |
| (−1, 0) | ↔ | (1, 1) |
| (0) | ↔ | (0) |

As with the case of the "right-left" coding, this table makes it possible to eliminate the negative digits from the NAF form.

In order to carry out the "left-right" compact coding of an NAF(N) representation, the conversion rules of this table are applied, commencing the operations with the left-hand portion of the NAF expression, moving towards the right.

The example of the number 29, whose NAF form according to the Reitwiesner method is <1 0 0 −1 0 1> (FIG. 3, Section II), will be considered again.

The "left-right" compact form is obtained from the NAF representation in the same way as for obtaining the "right-left" compact form except that the digits of the NAF representation are now scanned from left to right and Table I above is replaced with Table II. In addition, if the last digit scanned of the representation is non-zero, a 0 can be added artificially after the decimal point in order to be able to apply the correspondence table. Finally, if the compact representation given by concatenating the various blocks thus obtained by the correspondence table, from left to right, the digit after the decimal point is zero and can be ignored.

With the artificial 0 after the decimal point, this gives NAF(29)=<1,0,0,−1,0,1.0>. Commencing with the left, the first digit is 1 (i.e. the first to the left). As it is non-zero, the following digit is scanned (i.e. the second digit 0 commencing with the left. The correspondence table converts the pair of digits (1,0) into (1,0). The following digit of the NAF representation is 0. The correspondence tables makes (0) correspond to it. The following digit of the NAF representation is −1; the following digit, which is 0, is therefore scanned. The correspondence table makes the pair (1,1) correspond to the pair (−1,0). The following digit in the NAF representation is 1 followed by a decimal point and 0. The correspondence table associates the pair (1,0) with the pair (1,0). By concatenating the blocks obtained from left to right, the "left-right" compact form 100111.0 is obtained. The digit after the decimal point being zero, it can be ignored and finally 100111 is obtained.

From the "left-right" coding, the associated non-adjacent form is found by proceeding in the reverse fashion. Again with an example N=29 with a "left-right" compact representation given by <1,0,0,1,1,1.0> (note the artificial 0 after the decimal point), the digits are scanned from left to right of this representation applying the rules of the correspondence table in order to successively obtain the blocks (1,0), (0), (−1,0) and (1,0).

Concatenation gives <1,0,0,−1,0,1.0>, where the 0 following the decimal point can be ignored, and NAF(29)=<1,0,0,−1,0,1> is found.

The compact coding of the non-adjacent forms according to the invention finds many industrial applications, some of which are mentioned below.

In cryptography, the random number k is frequently taken and the value $y=g^k$ in a given group calculated, for example the multiplying group of a finite field or the points on an elliptic curve defined on a field.

A uniformly distributed random number k is then required, for example in order to calculate, on an elliptic curve, k times a point P. With regard to anything concerning exponentiation operations (or multiplication operations), it may be desirable for the number k to be in the form of an NAF (since it has a minimum number of non-zero digits, and the calculation is then all the more rapid).

Take the case of a random integer number k. This integer, when it is returned to an initial form by the hardware or software means, is in its simple binary representation of a number r of bits.

By virtue of the coding according to the invention, it is possible to produce this random number k rapidly in a non-adjacent form which is denoted R(k), without having to carry out a conversion according to the Reitwiesner method.

To do this, a number k is chosen in the domain $\{0,1\}^r$, expressed in simple binary form. There is applied to the series of bits in this binary sequence the conversion which is the reverse of the right-left conversion (cf. Table Ib), that is to say:

(0,1)→(0,1); (1,1)→(0,−1); (0)→(0).

If during this conversion the most significant digit in the representation is −1, this representation is padded with one or more zeros as far as the position (r−1), and a 1 is added at the position r.

The whole of the representation thus obtained will be designated by the term "representation R".

By way of example, assume that a random number of three bits is taken. All the possibilities from 0 to 7 of this grouping of three bits are listed in Table III below.

TABLE III representations of a number k of three bits in its binary form, NAF(k) and R(k)

| k | NAF(k) | R(k) |
|---|---|---|
| $0_2$ | <0> | 0 |
| $1_2$ | <1> | 1 |
| $10_2$ | <1, 0> | 1, 0 |
| $11_2$ | <1, 0, −1> | 1, 0, 0, −1 |
| $100_2$ | <1, 0, 0> | 1, 0, 0 |
| $101_2$ | <1, 0, 1> | 1, 0, 1 |
| $110_2$ | <1, 0, −1, 0> | 1, 0, −1, 0 |
| $111_2$ | <1, 0, 0, −1> | 1, 0, −1 |

In the column alongside there is the NAF of these numbers, given by the Reitwiesner algorithm, and in the third column the right to left conversion on these ks is applied.

The compact right-left coding as described previously converts the binary representations for k ranging from 0 to 7 in accordance with the following table:

| k | NAF obtained considering k as a "right-left" compact form |
|---|---|
| 0 | 0 |
| 1 | 1 |
| 10 | 1, 0 |
| 11 | −1 |
| 100 | 1, 0, 0 |
| 101 | 1, 0, 1 |
| 110 | −1, 0 |
| 111 | 1, 0, −1 |

Sometimes NAFs representing negative numbers are obtained (when the most significant non-zero is −1). In the example, this is the case with k corresponding to the representation 11 or 110. In this case, zeros are added as far as the position 3−1=2 and then a 1 is added at the position r=3. Thus there is finally obtained:

| k | NAF obtained considering k as a "right-left" compact form | R(k) |
|---|---|---|
| 0 | 0 | <0> |
| 1 | 1 | <1> |
| 10 | 1, 0 | <1, 0> |
| 11 | −1 | <1, 0, 0, −1> |
| 100 | 1, 0, 0 | <1, 0, 0> |
| 101 | 1, 0, 1 | <1, 0, 1> |
| 110 | −1, 0 | <1, 0, −1, 0> |
| 111 | 1, 0, −1 | <1, 0, −1> |

This will give the representation which will be called R.

It is clear that the representation R has the remarkable property of permuting the set $\{NAF(k)|k\in\{0,1\}^r\}$.

Thus it is noted that all the values NAF(k) are in R(k) for the list in Table III. This is true for all the powers of k. Therefore, if a random number of k bits is required, whatever the value of k, the application of the conversion R will give all the NAF(k) values although not necessarily in the same order. The demonstration of this proposition is immediate for a person skilled in the art and is not the object of this disclosure.

In the prior art, it was necessary to draw a random number, calculate its NAF, and then use this NAF in order to calculate k.P on the elliptic curve, for example.

With the invention, a random number k is taken, the conversion R is performed on this number, and the result of this conversion R(k) serves straightaway as a non-adjacent form NAF of a number k', also random (that is to say NAF(k')), which can be used for carrying out the calculation. (This number k' can be the same as k or different, according to the characteristics of the permutation and the value of k in question.) This is because, since it is processed with uniformly distributed random numbers, it is of no matter whether the random number actually used is the one (k) designated originally in its binary form or possibly another number (k') in the set which results from the conversion giving NAF(k') directly from k.

In this way, it is no longer necessary to calculate a non-adjacent form specific to the random number originally designated. This makes it possible to save space in the memory, since it is not necessary to store the NAF calculation algorithm.

At the security level, nothing is lost since the two sets $\{R(k)\}$ and $\{NAF(k)\}$ are equal for k in $\{0,1\}^r$—the distribution therefore remains uniform.

The invention is particularly advantageous for calculations on elliptic curves where the non-adjacent representations are advantageously used.

Hereinafter, a few non-exhaustive examples of concrete applications of the compact coding according to the present invention will be given.

Figure 4:
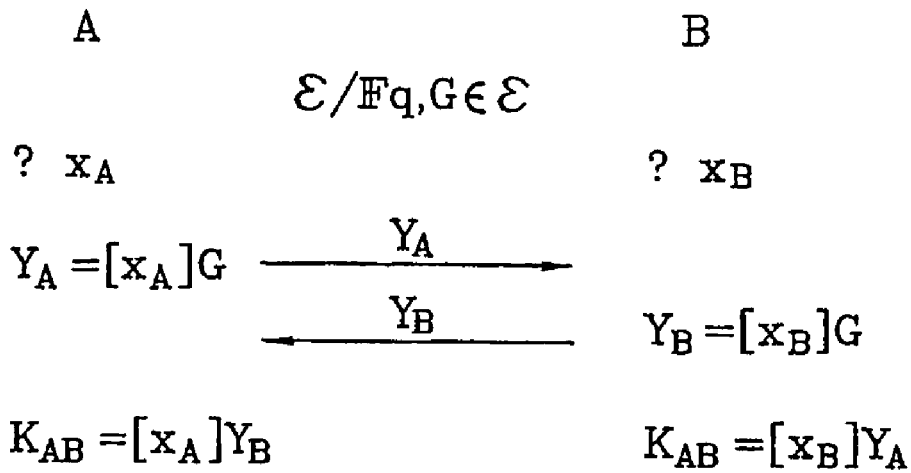
FIG. 4 is a block diagram explaining an application of the invention to the exchange of keys in enciphering according to the Diffie-Hellman method.

A first example concerns the exchange of keys in the cryptographic domain, according to the Diffie-Hellman method, the main steps of which are set out in the block diagram in FIG. 4.

Let there be two interlocutors A and B who do not know each other. They have to exchange a key for cryptographic purposes. It is assumed that the channel between A and B is passive: it is possible simply to take cognisance of values which pass over this channel, but not to modify them.

First of all, A and B agree on an elliptic curve E on $F_q$, and also on a point G which belongs to this curve.

In the protocol, A chooses a random number $x_A$ and calculates the point on the curve $Y_A=[x_A]G$.

For his part, B chooses a random number $x_B$ and calculates the point on the curve $Y_B=[x_B]G$.

Next, A sends the value of $Y_A$ to B, and B sends the value of $Y_B$ to A. Their common key is the key $K_{AB}=[x_A.x_B]G$.

A obtains this key by calculating $[x_A.]Y_B$, that is to say its secret $x_A$ times the value $y_B$ received from B. In a similar manner, B calculates $[x_B]y_A$, and arrives at the same result.

The advantage of the method proposed is that, as work is being carried out on elliptic curves, it is advantageous to have representations in its NAF form for the multipliers $x_A$ and $x_B$. A and B take a random number (given as a binary series) whose source is the hardware or the software. They interpret this number with the conversion R and have directly a non-adjacent form (NAF). In other words, calculating NAF now becomes unnecessary.

It should be noted in this context that the invention is not limited to elliptic curves.

Figure 5:
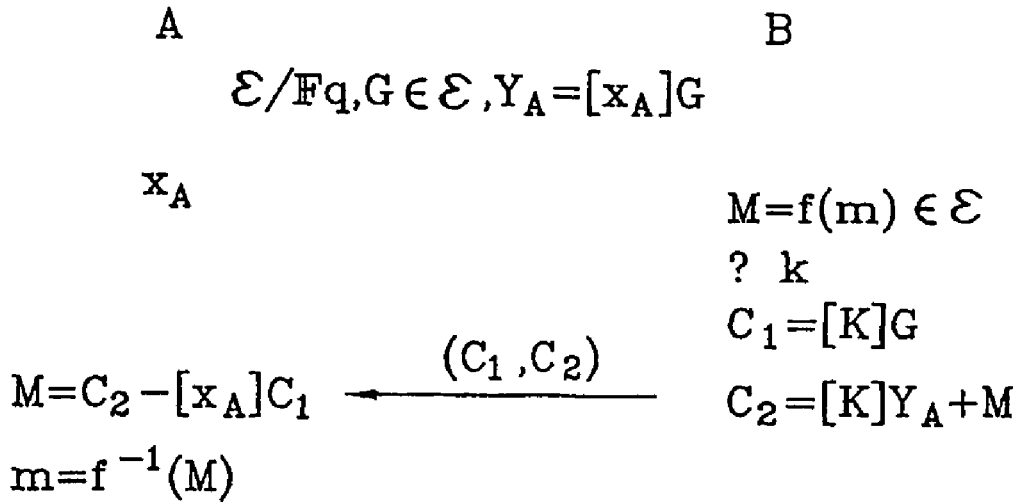
FIG. 5 is a block diagram of message enciphering according to the El Gamal method.

Another example of an application of the invention concerns enciphering. The aim is then to enable B to send a message to A, with the condition that only A must be capable of deciphering it. This example will be described in the context of enciphering according to El Gamal, the main steps of which are set out in the block diagram in FIG. 5.

A possesses public parameters, namely an elliptic curve E on $F_q$, a point G on a curve, and another point $Y_A$. A also possesses a secret value $x_A$. The point $Y_A$ is given by $Y_A=[x_A]G$.

B sends an enciphered message m to A. First of all he represents the message m as a point M on the curve ($M \in E$). He calculates $C_1=[k]G$, where k is a random number, and $C_2=[k]Y_A+M$ (G being a public parameter). B sends $C_1$ and $C_2$ to A, that is to say the enciphered text which corresponds to the enciphered message m.

To find this message, A calculates $C_2-[x_A]C1$, where $x_A$ is its secret. A will find the point M, from which he can find the corresponding message.

Here too, it is possible to apply the compact coding technique according to the invention, in inverse form, for processing the random number k. The result thus obtained is interpreted as an non-adjacent form of the random number k, from which the calculations are made.

This aspect of the invention is also advantageous with regard to A, who needs to know his key $x_A$. Ordinarily, the NAF of this key is calculated, this being used for the algorithms. Here also, A can represent his secret key $x_A$ by the most compact representation (saving in space). He then stores the compact form rather than its conventional binary representation.

For calculating multiples of points on E, A and B only need to consider the binary expansion of the scalar multiplicand as a representation given by the compact coding. It should be noted that, since the conversions are one to one, there is no loss of security. In addition, it is possible to obtain uniformity, if desired.

It will be understood from the above that the concept of the invention allows:
  the compact representation of a number which is initially given in its non-adjacent form (NAF). In this case, the left-right or right-left conversion is applied. There is then an equivalent representation which takes up no more space in memory than the conventional binary representation (and it is that which it will be possible to store);
  the production of uniformly distributed random numbers in a non-adjacent form, drawing a random number in a conventional binary representation, and applying to this a conversion R which will give another number, also random and uniformly distributed, in non-adjacent form.

One of the advantageous applications of the invention is found in the digital signature scheme ECDSA (Elliptic Curve Digital Signature Algorithm). It is the standard for the signatures on elliptic curves.

The invention can also be used in many other arithmetic applications, in particular for multiplication or exponentiation.

The invention claimed is:

1. A device for processing numerical values, comprising:
  first storage means having at least one correspondence table that defines correspondences between first sets of at least one digit, expressed according to a signed code where each digit has a value of 0, 1 or −1, and second sets of at least one digit, expressed according to a simple form where each digit has a value of 0 or 1; and
  conversion means including:
    means for inputting values to be processed in the form of a sequence of digits,
    decomposition means for decomposing the sequence of digits into sets of digits appearing in said correspondence table, extraction means for extracting from the correspondence table, for each set of digits resulting from the decomposition, the corresponding set of digits given by said correspondence table, compilation means for compiling a sequence of digits from the sets extracted by the extraction means, and means for outputting the sequence compiled by the compilation means, wherein the conversion means generates a compact coded outputted sequence of digits from the inputted sequence of digits expressed according to the signed code, or the conversion means generates a non-compact coded outputted sequence of digits from the inputted sequence of digits expressed according to the simple form, the compact coded sequence of digits requiring less storage space than the non-compact coded sequence of digits.

2. A device according to claim 1, wherein each of the sets thus matched by said correspondence table have the same number of digits.

3. A device according to claim 1, wherein the conversion means process values k expressed in signed mode in non-adjacent form, formed by a sequence of digits $< \ldots, k_2, k_1, k_0 >$ with $k = \Sigma k_i b^i$, where b is any symbol, and $k_i$ are in the set $\{0, 1, -1\}$ and satisfy the condition $k_i . k_{i+1} = 0$ for any i in the sequence.

4. A device according to claim 1, wherein the conversion means process k values expressed in signed binary mode in non-adjacent form, formed from a sequence of digits $< \ldots, k_2, k_1, k_0 >$ with $k = \Sigma k_i 2^i$ and satisfying the condition $k_i . k_{i+1} = 0$, for any i in the sequence.

5. A device according to claim 1, wherein the first sets in said correspondence table comprise one or two digits, where one of them is the digit 0.

6. A device according to claim 1, wherein said correspondence table establishes the following correspondence between said first and second sets of digits:

| first sets of digits | | second sets of digits |
| --- | --- | --- |
| 0, 1 | ↔ | 0, 1 |
| 0, −1 | ↔ | 1, 1 |
| 0 | ↔ | 0. |

7. A device according to claim 6, wherein the conversion means add a digit 0 to the left of a sequence of digits inputted $<k_n, \ldots, k_2, k_1, k_0>$ (in front of the digit $k_n$) in order to form a sequence to be decomposed, the decomposition means identifies in this sequence the sets of digits appearing in the first sets in the table, commencing from the set situated furthest to the right (containing the digit $k_0$) and finishing with the set furthest to the left (containing the added digit 0), the compilation means form a compiled sequence, formed from simple binary digits, collecting together the second sets corresponding to said first sets, obtained by the extraction means, and said second sets are placed according to the same topology as the first corresponding sets in the decomposed sequence.

8. A device according to claim 7, wherein the compilation means truncate the digit 0 at the head (to the left) of said compiled sequence before delivering the latter to the output means.

9. A device according to claim 1, wherein said correspondence table establishes the following correspondences between said first and second sets of digits:

| first sets of digits | | second sets of digits |
| --- | --- | --- |
| 1, 0 | ↔ | 1, 0 |
| −1, 0 | ↔ | 1, 1 |
| 0 | ↔ | 0. |

10. A device according to claim 9, wherein the conversion means add a digit 0 to the right of the sequence of digits $<k_n, \ldots, k_2, k_1, k_0>$ (after the digit $k_0$) in order to form a sequence to be decomposed, and wherein the decomposition means identify in the sequence the sets of digits appearing in the first sets in the table, commencing from the set situated furthest to the left (containing the digit $k_n$) and finishing with the set furthest to the right (containing the added digit 0), the compilation means form a compiled sequence, formed from simple binary digits, collecting together the second sets corresponding to said first sets, obtained by the extraction means, and said second sets are placed according to the same topology as the corresponding sets in the decomposed sequence.

11. A device according to claim 10, wherein the compilation means truncate the digit 0 at the end (at the right) of said compiled sequence before delivering the latter to the output means.

12. A device according to claim 1, wherein said numerical value is an input value k expressed in a signed binary form, formed by a sequence of digits $< \ldots, k_2, k_1, k_0>$ with $k_i$ in the set $\{0, 1, -1\}$ and satisfying the condition $k_i . k_{i+1} = 0$, for any i in the sequence, and wherein the decomposition means produces from this value at least a first set of digits in the correspondence table, the extraction means obtains therefrom at least one second corresponding set of digits, and the compilation means forms a sequence from the second set thus extracted.

13. A device according to claim 12, wherein the conversion means add a digit 0 to the left of a sequence of digits inputted $<k_n, \ldots, k_2, k_1, k_0>$ (in front of the digit $k_n$) in order to form a sequence to be decomposed, the decomposition means identifies in this sequence the sets of digits appearing in the first sets in the table, commencing from the set situated furthest to the right (containing the digit $k_0$) and finishing with the set furthest to the left (containing the added digit 0), the compilation means form a compiled sequence, formed from simple binary digits, collecting together the second sets corresponding to said first sets, obtained by the extraction means, and said second sets are placed according to the same topology as the first corresponding sets in the decomposed sequence.

14. A device according to claim 13, wherein the compilation means truncate the digit 0 at the head (to the left) of said compiled sequence before delivering the latter to the output means.

15. A device according to claim 12, wherein the conversion means add a digit 0 to the right of the sequence of digits $<k_n, \ldots, k_2, k_1, k_0>$ (after the digit $k_0$) in order to form a sequence to be decomposed, and wherein the decomposition means identify in the sequence the sets of digits appearing in the first sets in the table, commencing from the set situated furthest to the left (containing the digit $k_n$) and finishing with the set furthest to the right (containing the added digit 0), the compilation means form a compiled sequence, formed from simple binary digits, collecting together the second sets corresponding to said first sets, obtained by the extraction means, and said second sets are placed according to the same topology as the corresponding sets in the decomposed sequence.

16. A device according to claim 15, wherein the compilation means truncate the digit 0 at the end (at the right) of said compiled sequence before delivering the latter to the output means.

17. A device according to claim 1, wherein the output means are connected to second storage means that store at least one compiled sequence as a sequence in compact coding of a corresponding value expressed in signed binary form.

18. A device according to claim 17, further including processing means comprising:
means for accessing said second storage means to supply a compiled sequence to the input means, wherein said conversion means is configured to effect a conversion of said compiled sequence into a signed binary representation in non-adjacent form of the value k associated with this compiled sequence; and
algorithmic calculation means functioning with at least one variable expressed by a signed binary representation in non-adjacent form, supplied by said conversion means.

19. A device according to claim 18, wherein the algorithmic calculation means carry out calculations on elliptic curves, including curves of the ABC (Anomalous Binary Curves) type.

20. A device according to claim 18, wherein the algorithmic calculation means produce cryptographic algorithms.

21. A device according to claim 20, wherein the cryptographic algorithm is a key exchange algorithm.

22. A device according to claim 21, wherein said algorithmic calculation means produce the key exchange algorithm according to the Diffie-Hellman method on elliptic curves.

23. A device according to claim 20, wherein the cryptographic algorithm is a data enciphering algorithm.

24. A device according to claim 23, wherein said algorithmic calculation means produce the data enciphering algorithm according to the El Gamal method on elliptic curves.

25. A device according to claim 20, wherein the cryptographic algorithm is a digital signature algorithm.

26. A device according to claim 1, wherein the conversion means are configured so as to effect an inverse conversion in order to reproduce a value expressed in non-adjacent form from a compiled sequence.

27. A device according to claim 1, wherein the conversion means establish a conversion (R) of a value k expressed in simple binary mode to a value k' expressed in signed binary mode in non-adjacent form (R(k)).

28. A device according to claim 27, wherein said conversion (R) permutes with the set $\{NAF(k)|k\in\{0,1\}^r\}$, where r is the maximum number of simple binary digits able to express the value k to the base 2, and NAF (k) corresponds to the expression of the value k in signed binary mode in non-adjacent form.

29. A device according to claim 27, further comprising means for creating random numbers expressed in signed binary mode in non-adjacent form, including a generator of random numbers which renders random numbers in simple binary form, said numbers being supplied to the means of inputting values to be processed, and wherein the conversion means establish a conversion (R) of said numbers to a representation in signed binary mode in non-adjacent form (R(k)) which are transmitted to the output means of the compiled sequence as a random number in signed binary mode in non-adjacent form.

30. A device according to claim 29, further comprising algorithmic calculation means functioning with at least one random number expressed by a signed binary representation in non-adjacent form.

31. Use of the device according to claim 1 for the processing of digital values expressed in non-adjacent form and the storage of said values in the form of a compiled sequence obtained by said compilation means.

32. A chip card having an integral device for processing numerical values, that comprises:
first storage means having at least one correspondence table that defines correspondences between first sets of at least one digit, expressed according to a signed code where each digit has a value of 0, 1 or −1, and second sets of at least one digit, expressed according to a simple form where each digit has a value of 0 or 1; and
conversion means including:
means for inputting values to be processed in the form of a sequence of digits,
decomposition means for decomposing the sequence of digits into sets of digits appearing in said correspondence table,
extraction means for extracting from the correspondence table, for each set of digits resulting from the decomposition, the corresponding set of digits given by said correspondence table,
compilation means for compiling a sequence of digits from the sets extracted by the extraction means, and
means for outputting the sequence compiled by the compilation means
wherein the conversion means generates a compact coded outputted sequence of digits from the inputted sequence of digits expressed according to the signed code, or the conversion means generates a non-compact coded outputted sequence of digits from the inputted sequence of digits expressed according to the simple form, the compact coded sequence of digits requiring less storage space than the non-compact coded sequence of digits.

33. A method for processing numerical values, comprising the steps of:
establishing at least one correspondence table that defines correspondences between first sets of at least one digit, expressed according to a signed binary code where each digit has a value of 0, 1 or −1, and second sets of at least one digit, expressed according to a simple form where each digit has a value of 0 or 1; and
carrying out a conversion by the steps of:
receiving input values to be processed in the form of a sequence of digits,
decomposing said sequence of digits into sets of digits appearing in said correspondence table,
extracting from said correspondence table, for each set of digits resulting from the decomposition, a set of corresponding digits given by said correspondence table,
compiling a sequence of digits from the sets thus extracted, and
outputting the compiled sequence, wherein the outputting step comprises outputting a compact coded compiled sequence of digits from the inputted sequence of digits expressed according to the signed code, or outputting a non-compact coded compiled sequence of digits from the inputted sequence of digits expressed according to the simple form, the compact coded sequence of digits requiring less storage space than the non-compact coded sequence of digits.

34. A method according to claim 33, wherein each of the sets matched by said correspondence table has the same number of digits.

35. A method according to claim 33, wherein in the conversion, there are processed k values expressed in signed binary mode in non-adjacent form, formed by a sequence of digits $<\ldots, k_2, k_1, k_0>$ with $k = \Sigma k_i b^i$, where b is any symbol, and $k_i$ are in the set $\{0, 1, -1\}$ and satisfy the condition $k_i.k_{i+1}=0$ for any i in the sequence.

36. A method according to claim 33, wherein in the conversion, there are processed k values expressed in signed binary mode in non-adjacent form, formed from a sequence of digits $<\ldots, k_2, k_1, k_0>$ with $k=\Sigma k_i 2^i$ and satisfying the condition $k_i.k_{i+1}=0$, for any i in the sequence.

37. A method according to claim 33, wherein the first sets in said correspondence table comprise one or two digits, where one of them is the digit 0.

38. A method according to claim 33, wherein said correspondence table establishes the following correspondences between said first and second sets of digits:

| first sets of digits | | second sets of digits |
|---|---|---|
| 0, 1 | ⇆ | 0, 1 |
| 0, −1 | ⇆ | 1, 1 |
| 0 | ⇆ | 0. |

39. A method according to claim 38, further including the step of adding a digit 0 to the left of the sequence of digits inputted $<k_n \ldots, k_2, k_1, k_0>$ (in front of the digit $k_n$) in order to form a sequence to be decomposed, and wherein the decomposition step comprises the step of identifying in this sequence the sets of digits appearing in the first sets in the table, commencing from the set situated furthest to the right (containing the digit $k_0$), and finishing with the set furthest to the left (containing the added digit 0), and the compilation step produces a compiled sequence, formed from simple binary digits, collecting together the second sets corresponding to said first sets obtained by the extraction step, said second sets being placed according to the same topology as the first corresponding sets in the decomposed sequence.

40. A method according to claim 39, wherein the compilation step truncates the digit 0 at the head (at the left) of said compiled sequence before outputting the latter.

41. A method according to claim 33, wherein said correspondence table establishes the following correspondences between said first and second sets of digits:

| first sets of digits | | second sets of digits |
|---|---|---|
| 1, 0 | ⇆ | 1, 0 |
| −1, 0 | ⇆ | 1, 1 |
| 0 | ⇆ | 0. |

42. A method according to claim 41, further including the step of adding a digit 0 to the right of the sequence of digits $<k_n, \ldots, k_2, k_1, k_0>$ (after the digit $k_0$) in order to form a sequence to be decomposed, and wherein the decomposition step includes the step of identifying in the latter sequence the sets of digits appearing in the first sets in the table, commencing from the set situated furthest to the left (containing the digit $k_n$) and finishing with the set furthest to the right (containing the added digit 0), and the compilation step produces a compiled sequence, formed from simple binary digits, collecting together the second sets corresponding to said first sets obtained by the extraction step, said second sets being placed according to the same topology as the corresponding sets in the decomposed sequence.

43. A method according to claim 42, wherein the compilation step comprises the step of truncating the digit 0 at the end (at the right) of said compiled sequence before delivering the latter as an output.

44. A method according to claim 33, wherein said numerical value is an input value k expressed in a signed form, formed by a sequence of digits $<\ldots, k_2, k_1, k_0>$ with $k_i$ in the set $\{0, 1, -1\}$ and satisfying the condition $k_i.k_{i+1}=0$, for any i in the sequence, and wherein the decomposing step produces from this value at least a first set of digits in said correspondence table, the extracting step obtains therefrom at least one second corresponding set of digits, and the compiling step forms a sequence from the second set thus extracted.

45. A method according to claim 33 further comprising the step of storing said output of the compilation step as a sequence in compact coding of a corresponding value expressed in signed binary form.

46. A method according to claim 33 further including the step of performing a series of inverse conversion steps in order to reproduce a value expressed in non-adjacent form from a compiled sequence.

47. A method according to claim 33 further including a processing phase comprising the steps of:
receiving a compiled sequence as an input,
converting said compiled sequence into a signed binary representation in non-adjacent from of the value k associated with said compiled sequence, and
carrying out an algorithmic calculation with at least one variable expressed by a signed binary representation in non-adjacent form, supplied by the conversion step.

48. A method according to claim 47, wherein said calculations are carried out on elliptic curves, including curves of the ABC (Anomalous Binary Curves) type.

49. A method according to claim 47, wherein the algorithmic calculation produces cryptographic algorithms.

50. A method according to claim 49, wherein the cryptographic algorithm is a key exchange algorithm.

51. A method according to claim 49, wherein the cryptographic algorithm is a data enciphering algorithm.

52. A method according to claim 49, wherein the cryptographic algorithm is a digital signature algorithm.

53. A method according to claim 33, wherein the conversion step establishes a conversion (R) of a value k expressed in simple binary mode to a value k' expressed in signed binary mode in non-adjacent form (R(k)).

54. A method according to claim 53, wherein said conversion (R) permutes with the set $\{NAF(k) | k \in \{0, 1\}^r\}$, where r is the maximum number of simple binary digits able to express the value k to the base 2, and NAF (k) corresponds to the expression of the value k in signed mode in non-adjacent form.

55. A method according to claim 53 further including a phase of creating random numbers expressed in signed binary mode in non-adjacent form, said phase comprising the steps of:
drawing a random number in simple binary form, said number being supplied at the step of inputting values to be processed,
establishing by means of the conversion step a conversion (R) of said random number k to a value k' expressed in signed binary mode in non-adjacent form (R(k)), and
transmitting, as an output of the compiled sequence, a random number in signed binary mode in non-adjacent form.

56. A method according to claim 55, further including an algorithmic calculation phase with at least one random number expressed by a signed binary representation in non-adjacent form, supplied by the conversion step.

57. Use of the method according to claim 33 in a chip card.

58. Use of the method according to claim 33 for the processing of numerical values in signed binary mode expressed in non-adjacent form and the storage of said values in compiled sequence form obtained by means of the compilation step.

* * * * *